(12) United States Patent
Chung

(10) Patent No.: US 6,890,869 B2
(45) Date of Patent: May 10, 2005

(54) LOW-DIELECTRIC SILICON NITRIDE FILM AND METHOD OF FORMING THE SAME, SEMICONDUCTOR DEVICE AND FABRICATION PROCESS THEREOF

(75) Inventor: Gishi Chung, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/333,683

(22) PCT Filed: Aug. 19, 2001

(86) PCT No.: PCT/JP01/07061

§ 371 (c)(1),
(2), (4) Date: Jan. 23, 2003

(87) PCT Pub. No.: WO02/17374

PCT Pub. Date: Feb. 28, 2002

(65) Prior Publication Data

US 2003/0162412 A1 Aug. 28, 2003

(30) Foreign Application Priority Data

Aug. 18, 2000 (JP) ........................ 2000-248922

(51) Int. Cl.[7] .................................. H01L 21/469
(52) U.S. Cl. ........................... 438/794; 257/77
(58) Field of Search ................ 438/794; 257/776

(56) References Cited

U.S. PATENT DOCUMENTS

| | | | | |
|---|---|---|---|---|
| 6,045,877 A | * | 4/2000 | Gleason et al. | 427/522 |
| 6,333,278 B1 | * | 12/2001 | Matsuura | 438/790 |
| 6,391,803 B1 | * | 5/2002 | Kim et al. | 438/787 |
| 6,410,463 B1 | * | 6/2002 | Matsuki | 438/790 |
| 6,486,083 B1 | * | 11/2002 | Mizuno et al. | 438/794 |
| 6,605,540 B2 | * | 8/2003 | Ali et al. | 438/694 |
| 6,617,690 B1 | * | 9/2003 | Gates et al. | 257/758 |
| 2001/0029114 A1 | * | 10/2001 | Vulpio et al. | 438/794 |
| 2001/0030369 A1 | | 10/2001 | MacNeil et al. | |
| 2002/0197890 A1 | * | 12/2002 | Mizuno et al. | 438/794 |
| 2003/0030057 A1 | * | 2/2003 | Bencher et al. | 257/77 |
| 2003/0047533 A1 | * | 3/2003 | Reid et al. | 216/24 |

FOREIGN PATENT DOCUMENTS

| | | |
|---|---|---|
| EP | 661386 | 7/1995 |
| JP | 6-244172 | 9/1994 |

* cited by examiner

*Primary Examiner*—George Fourson
*Assistant Examiner*—Fernando L. Toledo
(74) *Attorney, Agent, or Firm*—Crowell & Moring LLP

(57) ABSTRACT

A method of forming a silicon nitride film includes a CVD process that uses an organic Si compound having an organic silazane bond as a gaseous source. The CVD process is conducted under a condition that the organic silazane bond in the organic Si source is preserved in the silicon nitride film.

14 Claims, 11 Drawing Sheets

1,1,3,3,5,5,7,7-octamethylcylotetrasilazane
($Si_4C_8H_{28}N_4$)

hexamethylsilazane ($Si_2C_6H_{19}N$)

United States Patent

LOW-DIELECTRIC SILICON NITRIDE FILM AND METHOD OF FORMING THE SAME, SEMICONDUCTOR DEVICE AND FABRICATION PROCESS THEREOF

TECHNICAL FIELD

The present invention generally relates to semiconductor devices and more particularly to a semiconductor device having a low-dielectric insulation film and fabrication process thereof.

With advancement in the art of device miniaturization, recent leading-edge semiconductor integrated circuits include enormous number of semiconductor device elements therein. In such large-scale semiconductor integrated circuits, it is not sufficient to use a single interconnection layer for interconnecting the semiconductor device elements therein, and thus, it is generally practiced to provide a multilayer interconnection structure, in which a plurality of interconnection layers are stacked with each other with interlayer insulation films interposed therebetween, for interconnecting the semiconductor device elements.

Particularly, extensive investigations are being made on the process of forming a multilayer interconnection structure by using a dual damascene process. In a dual damascene process, interconnection grooves and contact holes are formed in advance in an interlayer insulation film and the interconnection grooves and the contact holes thus formed are filled by a conducting material. In such a dual damascene process, the role of the insulation film that is provided in the multilayer interconnection structure as an etching stopper and simultaneously as a metal diffusion barrier is extremely important.

BACKGROUND ART

While there are various modifications in the art of dual damascene process, FIGS. 11A–11F show a typical conventional method of forming a multilayer interconnection structure that uses a dual damascene process.

Referring to FIG. 11A, a Si substrate 10 is covered by an interlayer insulation film 11 of a CVD-$SiO_2$ film, and the like, and an interconnection pattern 12A is formed on the interlayer insulation film 11. The Si substrate 10 carries thereon various semiconductor device elements such as MOS transistors not illustrated.

The interconnection pattern 12A is embedded in a next interlayer insulation film 12B formed on the interlayer insulation film 11 to form an interconnection layer 12, wherein the interconnection layer 12 is covered by an etching stopper film 13 such as an SiN film. The etching stopper film 13 is further covered by a next interlayer insulation film 14.

In the step of FIG. 11A, a resist pattern 18 is formed on the interlayer insulation film 14 by a photolithographic process such that the resist pattern 18 has an opening 18A corresponding to a contact hole to be formed, and the interlayer insulation film 14 is removed by a dry etching process while using the resist pattern 18 as a mask. As a result of the dry etching process, there is formed an opening 14A in the interlayer insulation film 14 in correspondence to the contact hole to be formed.

Next, in the step of FIG. 11B, the resist pattern 18 is removed and a resist film 19 is formed on the structure of FIG. 11B in the step of FIG. 11C so as to fill the contact hole 14A. By patterning the resist film 19 thus formed by a lithographic process, a resist opening 19A is formed in the resist film 19 in correspondence to the interconnection pattern to be formed.

Next, in the step of FIG. 11D, the exposed part of the interlayer insulation film 14 exposed at the resist opening 19A is patterned by a dry etching process while using the resist film 19 as a mask. Thereafter, the resist film 19 is removed. As a result of such a patterning process, an opening 14B is formed in the interlayer insulation film 14 in correspondence to the desired interconnection groove in addition to the contact hole 14A.

Next, in the step of FIG. 11E, the etching stopper film 13 is removed by a dry etching process that uses an RIE process, and the interconnection pattern 12A is exposed.

Next, in the step of FIG. 11F, the interconnection groove 14B and the opening 14A are filled by a conductive film of Al or Cu. By applying a chemical mechanical polishing (CMP) process to the structure thus obtained, an interconnection pattern 20 is obtained in electric connection with the interconnection pattern 12A by the contact hole 14A.

By repeating the foregoing process steps, it is possible to form third and forth interconnection patterns.

In such multilayer interconnection structure for use in a semiconductor device, it is important to use a low-dielectric insulation film for the interlayer insulation films 12 and 14 so as to reduce the stray capacitance of the multilayer interconnection structure. By reducing the stray capacitance, the operational speed of the semiconductor device is improved. Thus, various attempts have been made to use a low-dielectric material for the interlayer insulation film 12 or 14, such as F-doped $SiO_2$ film (SiOF film), organic Si insulation film (SiOCH film), and the like. By using an organic Si insulation film, in particular, it is possible to realize a specific dielectric constant of 3.0 or less.

In such a process of forming a multilayer interconnection structure by a dual damascene process, the role of the etching stopper film 13 is important as noted previously. Conventionally, a SiN film, which shows a large etching selectivity with regard to the interlayer insulation film 14, is used extensively for this purpose. In the art of dual damascene process, the etching stopper film 13 is not only required to have a large etching selectivity but also to act as an effective barrier against diffusion of metals such as Cu that constitute the interconnection pattern. Further, the etching stopper film is required to have excellent adhesion with regard to the interconnection pattern and further to the interlayer insulation film. In addition, the etching stopper film is required to have excellent resistance against plasma ashing process or wet etching process. It is known that an SiN film functions as an efficient diffusion barrier.

Conventionally, an SiN film has been formed easily by a plasma CVD process. On the other hand, an SiN film thus formed has a large dielectric constant of 7–8. Thus, the effect the stray capacitance reduction achieved in the multilayer interconnection structure by the use of low-dielectric insulation film for the interlayer insulation films 12 and 14 is substantially cancelled out by the use of the SiN etching stopper film 13.

DISCLOSURE OF THE INVENTION

Accordingly, it is a general object of the present invention to provide a novel and useful semiconductor device and fabrication process thereof wherein the foregoing problems are eliminated.

Another and more specific object of the present invention is to provide a low-dielectric nitride film and fabrication process thereof.

Another object of the present invention is to provide a method of forming a multilayer interconnection structure that uses a low-dielectric silicon nitride film.

Another object of the present invention is to provide a semiconductor device having a low-dielectric silicon nitride film.

Another object of the present invention is to provide a method of forming a silicon nitride film, comprising the steps of:

introducing a substrate in a reaction chamber;

supplying an organic Si compound having an organic silazane bond therein into said processing chamber as a gaseous source;

depositing an SiNCH film containing Si, N, C and H as primary constituent elements on a surface of said substrate from said gaseous source by a CVD process.

According to the present invention, it becomes possible to form a low-density SiNCH film (a film containing Si, N, C and H as primary or major constituent elements) by the CVD process that uses the organic Si compound containing therein an organic silazane bond as the source material. The low-density SiNCH film thus formed is characterized by a low-dielectric constant and has excellent adhesion with respect to an underlying layer. The low-density SiNCH film further functions as an efficient diffusion barrier against metal atoms such as Cu. The low-density SiNCH film shows excellent resistance against plasma ashing process, dry etching process or wet etching process.

In the present invention, it is preferable that the organic Si compound has a structural formula of $(SiR_1)_nNR_2$, $(SiR_1NR_2)_n$ or $(SiR_1(NR_2)_{1.5})_n$, wherein n is an integer of 1 or more and each of $R_1$ and $R_2$ may be hydrogen or a group selected from an alkyl group such as methyl group, a cyclic hydrocarbon group such as a phenol group or a vinyl group. It is preferable to carry out the CVD process such that the silazane bond in the organic Si compound is substantially preserved in the SiNCH film. By using a compound having the structural formula of $(SiR_1)_nNR_2$, $(SiR_1NR_2)_n$ or $(SiR_1(NR_2)_{1.5})_n$ ($R_1$ and $R_2$ being hydrogen or a group selected from an alkyl group such as methyl group, a cyclic hydrocarbon group such as a phenol group or a vinyl group, n being an integer of 1 or more), the organic silazane bond in the source compound is preserved in the SiNCH film during the CVD process, and the SiNCH film shows a reduced density.

Preferably, the CVD process for depositing the SiNCH film includes a plasma polymerization process of the organic Si compound. It is further preferable that the plasma polymerization process is conducted under a plasma power in which the silazane bond in the organic Si compound is preserved substantially in the SiNCH film. By doing so, the density and specific dielectric constant of the SiNCH film is reduced effectively. In the case the step of depositing the SiNCH film is conducted by a pyrolytic polymerization process of the organic Si compound, it is necessary to set the temperature such that the organic silazane bond in the organic Si compound is substantially preserved in the deposited SiNCH film.

In the present invention, the SiNCH film may be deposited by an alternative process of adding an additional gaseous source containing N such as $N_2$ or $NH_3$ to the foregoing organic Si compound, forming plasma of the additional gaseous source, and supplying the plasma into the reaction chamber. According to such a process, only a small plasma power is provided to the organic source compound and the organic silazane structure in the organic Si compound is preserved in the silicon nitride film.

In the present invention, it is also possible to form a silicon oxynitride film of SiONCH system that contains oxygen, which may be released from the source material or a subsidiary source material. When the content of oxygen in the film is 40% or less, the silicon oxynitride film shows a property similar to that of the silicon nitride film explained before.

Another object of the present invention is to provide a method of fabricating a semiconductor device, comprising the steps of:

forming an etching stopper film on a substrate;

depositing an interlayer insulation film on said etching stopper film;

patterning said interlayer insulation film to form an opening;

etching said interlayer insulation film to form a depression in said interlayer insulation film in correspondence to said opening; and etching said etching stopper film selectively from said opening by an etching process, said step of depositing said etching stopper film comprising the steps of:

introducing said substrate into a reaction chamber of a processing apparatus;

supplying an organic Si compound containing an organic silazane bond therein into said reaction chamber as a gaseous source; and depositing an SiNCH film in said processing chamber on a surface of said substrate from said organic Si compound by a CVD process as said etching stopper film.

According to the present invention, a SiNCH film formed by a CVD process from a source material of an organic Si compound containing therein an organic silazane bond is used as silicon nitride etching stopper when forming a multilayer interconnection structure by a dual damascene process. The silicon nitride film thus formed preserves therein the organic silazane bond in the source material, wherein the organic silazane bond includes a hydrocarbon group therein. Thus, the silicon nitride film thus formed is characterized by a low density and is has a characteristically low dielectric constant. By using such a low-dielectric silicon nitride film for the etching stopper, the stray capacitance of the multilayer interconnection structure is reduced substantially and the operational speed of the semiconductor device is improved accordingly. The low-dielectric silicon nitride film thus formed has a further advantageous feature of excellent etching resistance, and thus, the low-dielectric silicon nitride film can be used as an effective etching stopper film or hard mask film in the dry etching process during the dual damascene process.

In the present invention, too, it is preferable that the organic Si compound has a structural formula of $(SiR_1)_nNR_2$, $(SiR_1NR_2)_n$ or $(SiR_1(NR_2)_{1.5})_n$, wherein n is an integer of 1 or more and each of $R_1$ and $R_2$ may be hydrogen or a group selected from an alkyl group such as methyl group, a cyclic hydrocarbon group such as a phenol group, or a vinyl group. It is preferable to carry out the CVD process such that the silazane bond in the organic Si compound is substantially preserved in the SiNCH film. By using a compound having the structural formula of $(SiR_1)_nNR_2$, $(SiR_1NR_2)_n$ or $(SiR_1(NR_2)_{1.5})_n$ ($R_1$ and $R_2$ being hydrogen or a group selected from an alkyl group such as methyl group, a cyclic hydrocarbon group such as a phenol group or a vinyl group, n being an integer of 1 or more), the organic silazane bond in the source compound is reserved in the SiNCH film during the CVD process, and the SiNCH film shows a reduced density.

Preferably, the CVD process for depositing the SiNCH film includes a plasma polymerization process of the organic Si compound. It is further preferable that the plasma polymerization process is conducted under a plasma power in which the silazane bond in the organic Si compound is preserved substantially in the SiNCH film. By doing so, the density and specific dielectric constant of the SiNCH film is reduced effectively. In the case the step of depositing the SiNCH film is conducted by a pyrolytic polymerization process of the organic Si compound, it is necessary to set the temperature such that the organic silazane bond in the organic Si compound is substantially preserved in the deposited SiNCH film.

In the present invention, the SiNCH film may be deposited by an alternative process of adding an additional gaseous source containing N such as $N_2$ or $NH_3$ to the foregoing organic Si compound, forming plasma of the additional gaseous source, and supplying the plasma into the reaction chamber. According to such a process, only a small plasma power is provided to the organic source compound and the organic silazane structure in the organic Si compound is preserved in the silicon nitride film.

In the present invention, it is also possible to apply a process for depositing a conductor layer on the interlayer, insulation film so as to fill the depression via the opening and for removing the part of the conductor layer locating above the interlayer insulation film by a chemical mechanical polishing process. Thereby, it is preferable that the conductor layer is formed of Cu. As the silicon nitride film functions as an efficient diffusion barrier against Cu, such a structure can effectively suppress the diffusion of Cu from the Cu layer to the adjacent interlayer insulation film. Further, the silicon nitride etching stopper film thus formed has excellent leakage characteristic.

By using an organic insulation film or a F-doped $SiO_2$ film for the interlayer insulation film, the capacitance of the interlayer insulation film is decreased and the overall stray capacitance of the multilayer interconnection structure is reduced. By forming the foregoing depression so as to include an interconnection groove or contact hole, various complex interconnection patterns can be formed.

Another object of the present invention is to provide a silicon nitride film in a system of SiNCH, said silicon nitride film containing therein an arbitrary atomic group represented as $C_nH_m$, said atomic group being bonded to a Si atom.

According to the present invention, the silicon nitride film contains therein an organic silazane bond, while the organic silazane bond in turn contains therein a hydrocarbon group. The silicon nitride film of the present invention has a characteristically low film density and associated feature of low dielectric constant. The atomic group may be any of an alkyl group, a cyclic hydrocarbon group or a vinyl group. The silicon nitride film of the present invention has an advantageous feature of excellent adhesion and resistance against various processes such as plasma ashing process, dry etching process or wet etching process. The silicon nitride film further functions as an effective diffusion barrier and is characterized by small leakage current.

Another object of the present invention is to provide a semiconductor device, comprising:

a substrate; and a multilayer interconnection structure formed on said substrate, said multilayer interconnection structure comprising an etching stopper film, an interlayer insulation film formed on said etching stopper film, an interconnection groove formed in said interlayer insulation film, a contact hole formed in said interlayer insulation film in correspondence to said interconnection groove, and a conductor pattern filling said interconnection groove and said contact hole, wherein said etching stopper film comprises a SiNCH film and contains therein an arbitrary atomic group represented as $C_nH_m$, said arbitrary atomic group being bonded to a Si atom.

According to the present invention, the silicon nitride film contains therein an organic silazane bond, while the organic silazane bond contains therein a hydrocarbon group. As a result, the density of the silicon nitride film is reduced, and the dielectric constant is reduced accordingly. Thus, the stray capacitance of the multilayer interconnection structure is reduced and the operational speed of the semiconductor device is improved. For the atomic group, any of hydrogen, an alkyl group, a cyclic hydrocarbon group or a vinyl group can be used. The silicon nitride film of the present invention shows excellent adhesion and resistance against plasma aching process, dry etching process or wet etching process. Further, the silicon nitride film of the present invention functions as efficient diffusion barrier against diffusion of metal element. Further, the silicon nitride film of the present invention has an advantageous feature of reduced leakage current.

Other objects and further features of the present invention will become apparent from the following detailed description when read in conjunction with the attached drawings.

BEST MODE FOR IMPLEMENTING THE INVENTION

[First Emobodiment]

Figure 1:
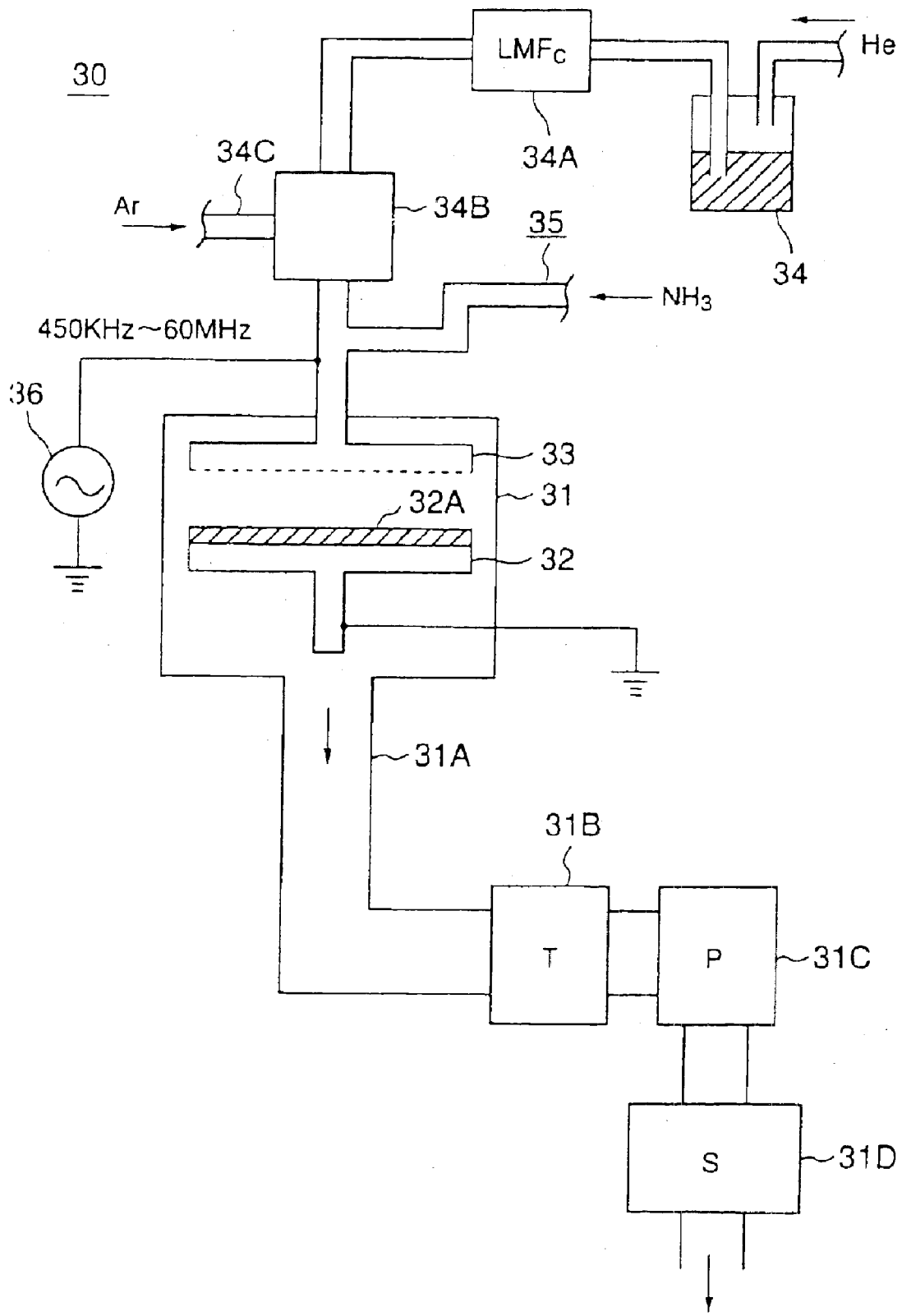
FIG. 1 is a diagram showing the construction of plasma CVD apparatus used in a first embodiment of the present invention.

FIG. 1 shows the construction of a plasma CVD apparatus 30 used in a first embodiment of the present invention.

Referring to FIG. 1, the plasma CVD apparatus 30 includes a reaction chamber 31 evacuated by a pump 31C via an evacuation port 31A and a trap 31B, wherein the reaction chamber 31 accommodates therein a stage 32 for holding a substrate 32A to be processed.

In the processing chamber 31, there is provided a showerhead 33 so as to face the stage 32, wherein the showerhead 33 is supplied with a liquid state organic Si source from a container 34. More specifically, the container 34 is pressurized by a He gas and the liquid state organic Si source therein is supplied to the showerhead 33 as a first gaseous source via a liquid mass-flow controller 34A and a vaporizer 34B together with an Ar carrier gas that is supplied from a line 34C.

Further, the showerhead 33 is supplied with an NH$_3$ gas or an N$_2$ gas via a line 35 as a second gaseous source, and plasma excitation is caused in the first and second gaseous sources by supplying thereto a radio-frequency power of 450 kHz–60 MHz from a radio-frequency power supply 36.

With formation of the plasma, there occurs plasma-polymerization in the reaction chamber 31 as the source materials are discharged from the showerhead 33, and the source materials thus supplied undergo plasma excitation. As a result of the plasma excitation, there occurs a deposition of silicon nitride film on the surface of the substrate 32A.

In the construction of FIG. 1, it should be noted that the pump 31C is connected to a scrubber unit 31D, and the exhaust of the pump 31C is discharged to the environment after being processed by the scrubber unit 31D.

Figure 2A:
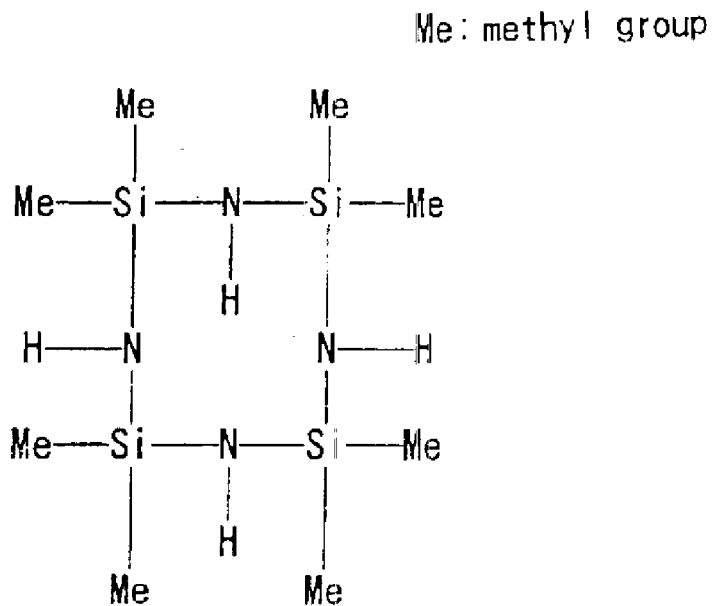
FIGS. 2A and 2B are diagrams showing examples of organic silazane bond used in the first embodiment of the present invention.
Figure 2B:
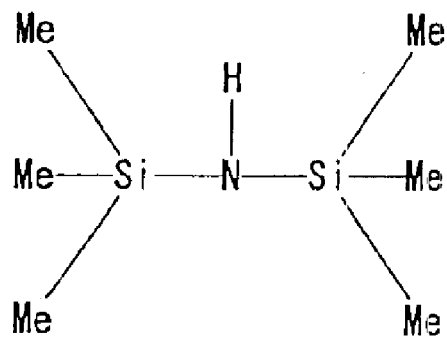

FIGS. 2A and 2B show the structural formula of an exemplary organic Si source material held in the source container 34, wherein FIG. 2A shows the case in which 1,1,3,3,5,5,7,7-octamethylcyclotetrasilazane is used for the organic Si source. In FIG. 2A, R$_1$ is a methyl group while R$_2$ is hydrogen. Thus, the organic Si source has a chemical formula of Si$_4$C$_8$H$_{28}$N$_4$. In the example of FIG. 2B, on the other hand, hexamethyldisilazane (Si$_2$C$_6$H$_{19}$N) is used for the organic Si source. It should be noted that these are representative examples of the organic Si source that contains therein organic silazane bond. A silazane bond is a general term used for the compounds that contain therein the Si—N—Si bond. An organic silazane compound is derived by adding an alkyl group such as methyl group or ethyl group, or a cyclic hydrocarbon group such as phenyl group, or a vinyl group to the Si—N—Si bond.

Examples of the organic silazane compounds are summarized in TABLE I below.

TABLE I

| | |
|---|---|
| Triethylsilazane | SiC6H17N |
| Tripropylsilazane | SiC9H23N |
| Triphenylsilazane | SiC18H17 |
| Disilazane | Si2H7N |
| Tetramethyldisilazane | Si2C4H15N |
| Hexamethyldisilazane | Si2C6H19N |
| Hexaethyldisilazane | Si2C12H31N |
| Hexaphenyldisilazane | Si2C36H31N |
| Heotamethyldisilazane | Si2C7H21N |
| Dipropyl-tetramethyldisilzne | Si2C10H27N |
| Di-n-butyl-tetranethyldisilazane | Si2C12H31N |
| Di-n-octyl-tetramethyldisilazane | Si2C20H47N |

TABLE I-continued

| | |
|---|---|
| Triethyl-trimethylcyclotrisilazane | Si3C9H27N3 |
| Hexamethylcyclotrisilazane | Si3C6H21N3 |
| Hexaethylcyclotrisilazane | Si3C12H33N3 |
| Hexaphenylcyclotrisilazane | Si3C36H33N3 |
| Octamethylcyclotrisilazane | Si4C8H28N4 |
| Octaethylcyclotetrasilazane | Si4C16H44N4 |
| Tetraethyl-tetramethylcyclotetrasilazane | Si4C12H36N4 |
| Cyanopropylmethylcyclosilazane | SiC5H10N2 |
| Tetraphenyldimethyldisilazane | Si2C26H27N |
| Diphenyl-tetramethyldisilazane | Si2C16H23N |
| Trivinyl-trimethylcyclotrisilazane | Si3C9H21N3 |
| Tetravinyl-tetramethylcyclotetrasilazane | Si4C12H28N4 |
| Divinyl-tetramethyldisilazane | Si2C8H19N |

Referring to FIGS. 2A and 2B, the foregoing organic Si source contains an organic silazane bond having a methyl group Me and has a composition represented by a general formula of (SiR$_1$)$_n$NR$_2$ or (SiR$_1$NR$_2$)$_n$, wherein n is an integer of 1 or more, while R$_1$ and R$_2$ have a general formula of C$_m$H$_{2m+1}$ (m being an integer larger than zero) and may be any of hydrogen atom, an alkyl group, a cyclic hydrocarbon group such as a phenyl group or a vinyl group.

Using the organic Si source noted above as a source, deposition of a silicon nitride film was conducted on an 8-inch Si wafer in the CVD apparatus 30 of FIG. 1 while using the Si wafer as the substrate 32A. The deposition of the silicon nitride film was conducted at a substrate temperature of 200–400° C. while supplying a plasma power of 100–1000 W at the frequency of 27 MHz. Detailed conditions are summarized in TABLE II below.

TABLE II

| | |
|---|---|
| substrate temperature | 200–400° C. |
| plasma power | 100–1000 W/27 MHz |
| chamber pressure | 13.3 Pa (100 mTorr) |
| organic Si source flow rate | 0.1 cc/min |
| NH3 flow rate | 50 SCCM |
| Ar flow rate | 200 SCCM |
| vaporizer temperature | 80–120° C. |

The silicon nitride film thus obtained is actually an SiNCH film and has a specific dielectric constant of 3.5–5.5.

It should be noted that the value of the specific dielectric constant of the silicon nitride film has decreased to one-half in view of the fact that an ordinary plasma SiN film has a specific dielectric constant of about 7–8. By using a small plasma power of 100–300 W in the foregoing deposition process, the vaporized organic Si compound supplied from the shower head 33 is not completely decomposed in the reaction chamber 31, and the organic silazane bond in the organic source is substantially preserved in the silicon nitride film thus deposited on the Si wafer. Because the existence of the organic silazane bond causes a decrease of density in the deposited SiN film, there occurs also a decrease of specific dielectric constant in the deposited SiN film.

Figure 3A:
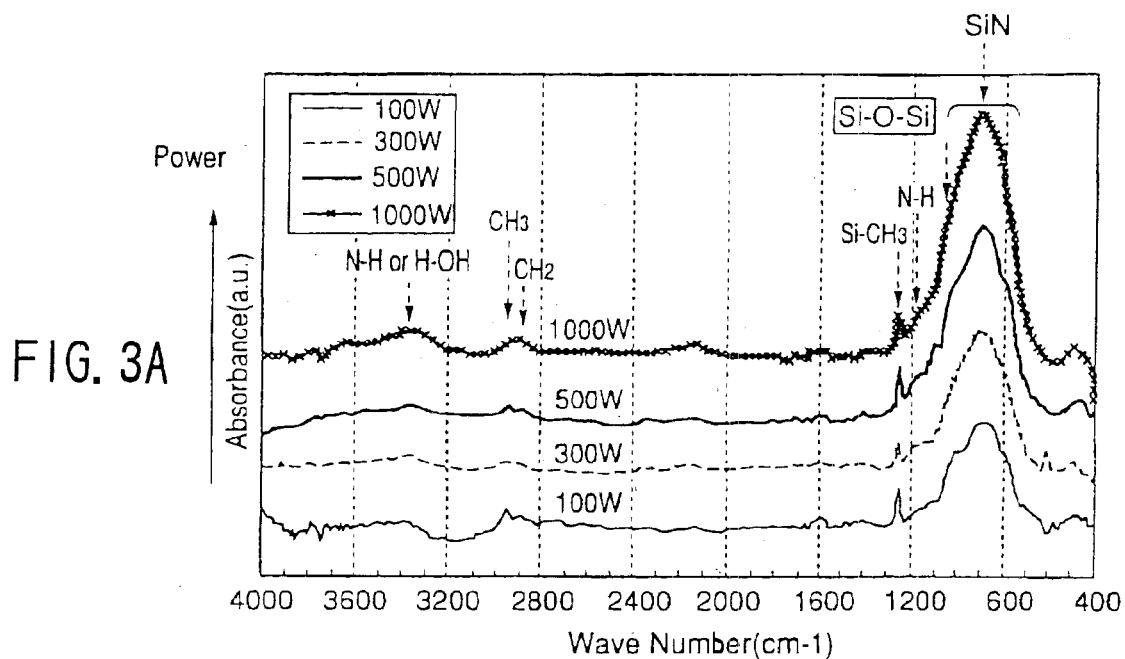
FIGS. 3A and 3B are diagrams showing an example of a silicon nitride film structure obtained in the first embodiment of the present invention.

FIG. 3A shows the structure of the silicon nitride film thus formed as observed by an FT-IR method.

Referring to FIG. 3A, it can be seen that the silicon nitride film thus formed preserves therein the hydrocarbon structure of Si—CH$_3$ or CH$_3$ originating from the organic silazane bond of FIG. 2A or 2B, while the hydrocarbon structure in the silicon nitride film reduces the density and hence the specific dielectric constant of the silicon nitride film.

FIG. 3A further indicates that the relative height of the peak corresponding to the Si—CH$_3$ bond with respect to the peak corresponding to the SiN-bond increases when the plasma power of 100 W is used as compared with the case of using the plasma power of 1000 W. This result clearly indicates that the silicon nitride film formed with the plasma power of 100 W contains the Si—$CH_3$ bond with increased concentration as compared with the silicon nitride film formed with the plasma power of 1000 W. Thus, it is concluded that the desired decrease of the specific dielectric constant has been caused as a result of the decrease of the film density in the deposited silicon nitride film.

Figure 3B:
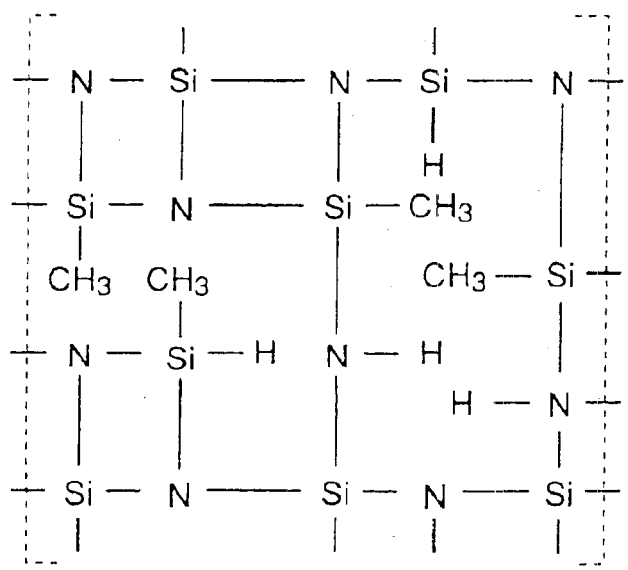

FIG. 3B shows a schematic structure of the silicon nitride film thus formed.

Referring to FIG. 3B, the silicon nitride film includes, in addition to the usual Si—N structure, the Si—$CH_3$ bond, N—H bond, Si—H bond, and the like that form together a network structure. The silicon nitride film having such a network structure can be formed from the organic silazane source while choosing the condition such as plasma power appropriately.

It should be noted that the SiNCH film thus obtained shows excellent adhesion with respect to an underlying film. Further, the SiNCH film shows excellent resistance against plasma ashing, dry etching and wet etching. Thus, the SiNCH film of the present invention can be used successfully in a multilayer interconnection structure.

It should be noted that TABLE II merely shows a typical example, and the SiNCH film of the present invention can be formed also by setting the plasma power in the range of 50–2000 W, the substrate temperature in the range from room temperature to 500° C., the process pressure in the range of 1.33–1.33 kPa (10 mTorr–10 Torr), or the supply rate of the liquid state organic Si source in the rage of 0.001–10 cc/min.

Further, it is also possible to form the SiNCH film by a pyrolytic CVD process. For example, such a pyrolytic CVD process may be conducted in the plasma CVD apparatus 30 of FIG. 2 without energizing the radio-frequency power supply 36.

In this case, the substrate temperature is set higher than the substrate temperature used in the plasma CVD process. However, the substrate temperature should not exceed 600° C. Otherwise, the organic silazane bond contained in the organic Si source would not be preserved in the SiNCH film.

[Second Embodiment]

FIGS. 4A–4F show the fabrication process of a semiconductor device having a multilayer interconnection structure according to a second embodiment of the present invention, wherein those parts corresponding to the parts described previously are designated by the same reference numerals and the description thereof will be omitted.

Figure 4A:
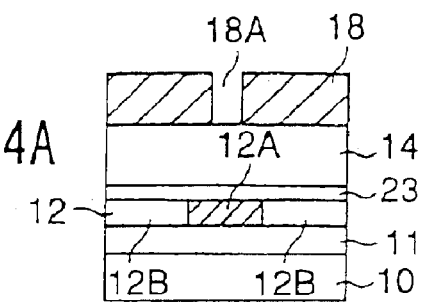
FIGS. 4A–4F are diagrams showing the fabrication process of a semiconductor device according to a second embodiment of the present invention.
Figure 11A:
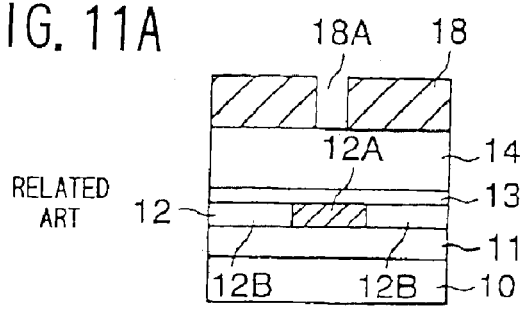
FIGS. 11A–11F are diagrams showing the fabrication process of a conventional semiconductor device.
Figure 11D:
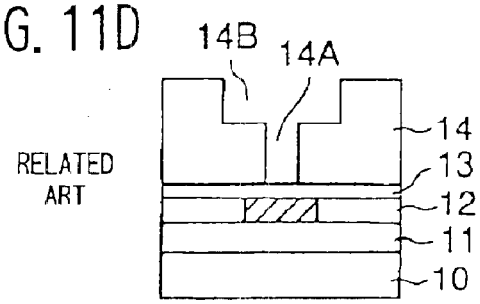
Figure 11B:
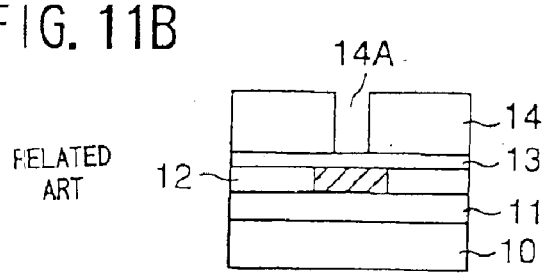
Figure 11E:
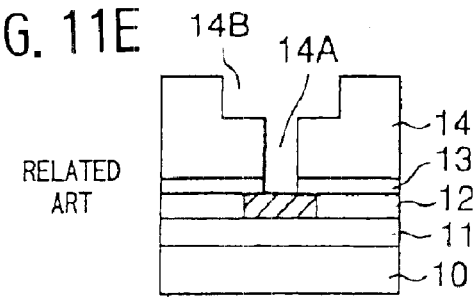
Figure 11C:
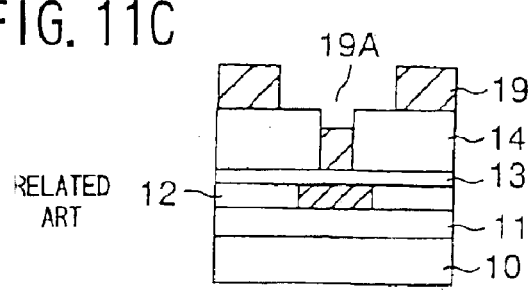
Figure 11F:
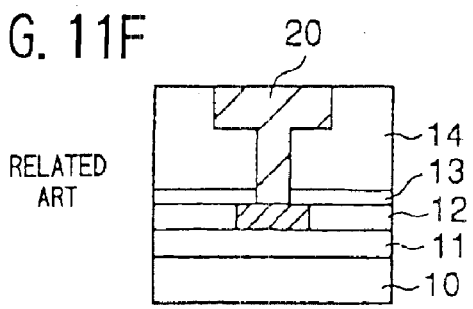

FIG. 4A corresponds to the step of FIG. 11A explained before and there is formed a similar layered structure, except that an SiNCH film formed from the organic Si source of FIG. 2A by the plasma CVD apparatus of FIG. 2 under the condition of TABLE II is used for an etching stopper film in place of the etching stopper film 13.

Figure 4D:
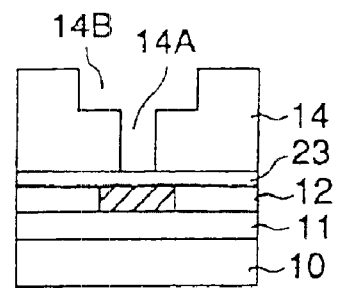
Figure 4B:
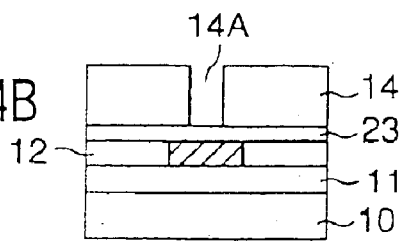

In the step of FIG. 4B, the interlayer insulation film 14 is subjected to a dry etching process while using the resist pattern 18 as a mask, and an opening corresponding to the resist opening 18A is formed in the interlayer insulation film 14. After formation of the opening, the resist pattern 18 is removed.

Next, in the step of FIG. 4C, a resist film 19 is formed newly on the structure of FIG. 4B, wherein the resist film 19 is patterned subsequently by a photolithographic patterning process to form a resist opening 19A corresponding the interconnection pattern to be formed in the multilayer interconnection structure.

Next, in the step of FIG. 4D, the interlayer insulation film 14 etched away by a dry etching process in the part exposed by the resist opening 19A while using the resist film 19 as a mask, and the resist film 19 itself is removed thereafter. As a result of the foregoing dry etching process and the resist removal process, the SiNCH film 23 is exposed at the bottom part of the opening 14A.

Figure 4E:
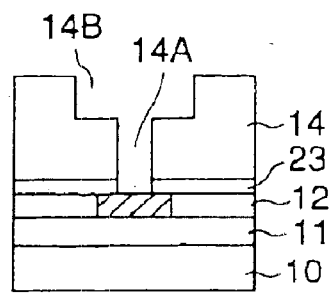
Figure 4C:
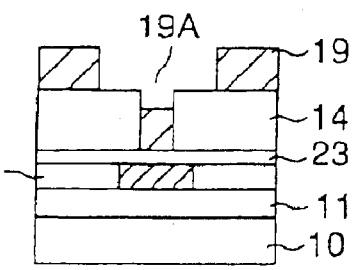

Next, in the step of FIG. 4E, a dry etching process is applied to the structure thus obtained and an opening 14B is formed in the SiNCH film 23 in correspondence to the opening 14A.

Figure 4F:
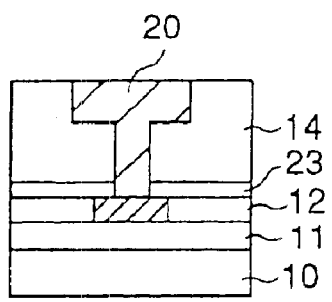

Further, in the step of FIG. 4F, the interconnection groove thus formed by the opening 14B and the contact hole thus formed by the opening 14A are covered by a barrier metal layer (not illustrated) of Ta, TaN, Ta/TaN, TiN, WN, and the like and are filled subsequently by a conductor layer such as a Cu layer. By removing the conductor layer covering the interlayer insulation film 14 by a CMP process, a conductor pattern 20 that makes a contact with the underlying interconnection pattern 14B at the contact hole 14A is obtained as represented in FIG. 6F.

For the interlayer insulation film 14, it is possible to use an inorganic low-dielectric insulation film such as a F-doped $SiO_2$ film, an HSQ film such as an SiOH film or a porous insulation film. Alternatively, it is possible to use a low-dielectric organic insulation film such as an organic SOG film or a low-dielectric organic insulation film of aromatic family for the interlayer insulation film 14. Of course, it is possible to use conventional CVD-$SiO_2$ films or SOG films for the interlayer insulation film 14. By using a low-dielectric inorganic or organic insulation film for the interlayer insulation film 14 in the multilayer interconnection structure, it becomes possible to reduce the overall dielectric constant of the multilayer interconnection structure and the operational speed of the semiconductor device is improved.

It should be noted that the SiNCH film 23 of the present embodiment has various properties such as excellent adhesion, excellent dry etching resistance, excellent performance as diffusion barrier to Cu, low leakage current, and the like, suitable for use in a multilayer interconnection structure of a high-speed semiconductor device.

[Third Embodiment]

FIGS. 5A–5E are diagrams showing the fabrication process of a semiconductor device according to a third embodiment of the present invention, wherein those parts corresponding to the parts described previously are designated by the same reference numerals and the description thereof will be omitted.

Figure 5A:
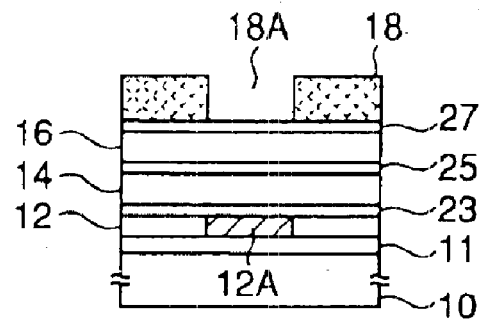
FIGS. 5A–5E are diagrams showing the fabrication process of a semiconductor device according to a third embodiment of the present invention.

Referring to FIG. 5A, the step is substantially identical with the step of FIG. 4A explained before, except that there are further provided an interlayer insulation film 16 and SiNCH films 25 and 27.

More specifically, the layered structure of FIG. 5A includes, in addition to the interlayer insulation film 11 formed on the Si substrate 10 and the interconnection layer 12 formed on the interlayer insulation film 11, the SiNCH film 23, the interlayer insulation film 14, the SiNCH film 25, the interlayer insulation film 16 and the SiNCH film 27 such that the films 23–27 are stacked consecutively, and the resist pattern having the resist opening 18A is now provided on the layered structure thus formed. Similarly to the previous embodiment, the resist opening 18A corresponds to the contact hole to be formed in the multilayer interconnection structure.

Figure 5B:
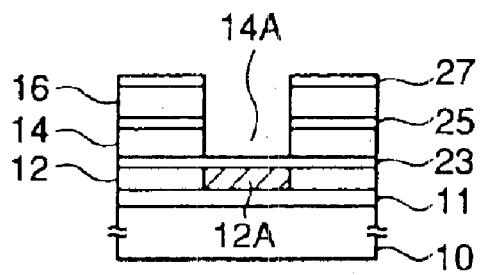

Next, in the step of FIG. 5B, the SiNCH film 27 is subjected to a dry etching process while using the resist pattern 18 as a mask, and an opening (not shown) is formed therein in correspondence to the resist opening 18A.

The opening thus formed exposes a part of the underlying interlayer insulation film 16, and the exposed part of the interlayer insulation film 16 is subjected to a dry etching process. As a result, there is formed an opening in the interlayer insulation film 16 in correspondence to the resist opening 18A so as to expose a part of the underlying SiNCH film 25. By applying a dry etching process to the SiNCH film 25 thus exposed, an opening exposing the underlying interlayer insulation film 14 is formed in correspondence to the resist opening 18A.

Further, by applying a dry etching process to the interlayer insulation film 14 thus exposed, the opening 14A is formed in the interlayer insulation film 14 in correspondence to the resist opening 18A. The opening 14A thus formed extends consecutively through the SiNCH film 27, the interlayer insulation film 16, the SiNCH film 25 and the interlayer insulation film 14 and exposes the SiNCH film 23 at the bottom part thereof.

Figure 5C:
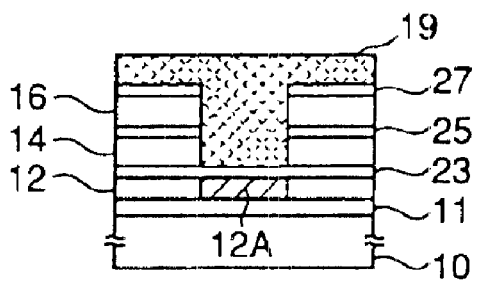
Figure 5D:
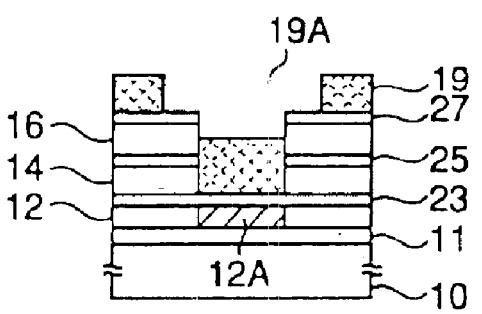

Next, in the step of FIG. 5C, the resist film 18 is removed and another resist film 19 is formed on the structure of FIG. 5B by a spin-coating process such that the resist film 19 fills the opening 14A, and the resist film 19 is subjected to a photolithographic patterning process in the step of FIG. 5D. As a result, the resist opening 19A is formed in the resist film 19 in correspondence to the interconnection groove to be formed in the multilayer interconnection structure.

Figure 5E:
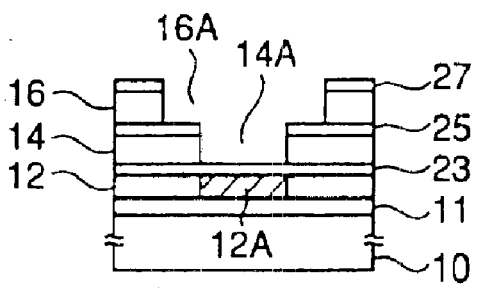

Next, in the step of FIG. 5E, the SiNCH film 27 is subjected to a dry etching process in the part exposed by the resist opening 19A while using the resist film 19 as a mask, and there is formed an opening in the SiNCH film 27 in correspondence to the resist opening 19A such that the opening exposes the underlying interlayer insulation film 16. The interlayer insulation film 16 thus exposed is then applied with a dry etching process until the underlying SiNCH film 25 is exposed. As a result, the opening 16A is formed in the interlayer insulation film 16 corresponding to the interconnection groove to be formed in the multilayer interconnection structure in correspondence to the resist opening 19A. Thereafter, the resist opening 19A is removed.

It should be noted that the dry etching process that is used for forming the opening 16A stops upon exposure of the SiNCH film 25. The multilayer interconnection structure explained previously with reference to FIG. 4F is then obtained by removing the exposed SiNCH films 27, 25 and 23 and further filling the opening 16A and 14A by a conductor layer such as a Cu layer.

In the present embodiment, too, it is possible to use any of the low-dielectric inorganic insulation films such as a F-doped SiO2 film, a HSQ film such as a SIOH film or a porous film, or the low-dielectric organic insulation films such as an organic SOG film or an organic insulation film of aromatic family, for the interlayer insulation films 14 and 16. In the multilayer interconnection structure of the present embodiment, the overall dielectric constant is reduced and the operational speed of the semiconductor device is improved.

In the present embodiment, too, the SiNCH films 23, 25 and 27 are characterized by low specific dielectric constant, excellent adhesion, excellent dry etching resistance, excellent performance as diffusion barrier of Cu, and low leakage current. Thus, the SiNCH films of the present invention are ideal for use in a multilayer interconnection structure of a high-speed semiconductor device.

[Fourth Embodiment]

FIGS. 6A–6E show the fabrication process of a semiconductor device according to a fourth embodiment of the present invention, wherein those parts corresponding to the parts described previously are designated by the same reference numerals and the description thereof will be omitted.

Figure 6A:
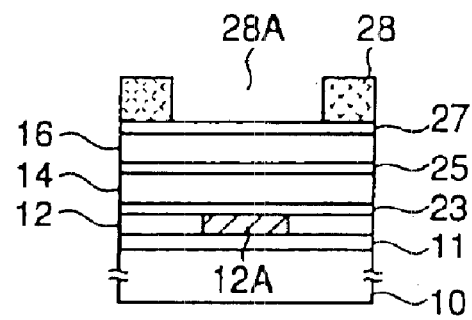
FIGS. 6A–6E are diagrams showing the fabrication process of a semiconductor device according to a fourth embodiment of the present invention.

Referring to FIG. 6A, the step of FIG. 6A is substantially identical with the step of FIG. 5A and there is formed a layered body on the Si substrate 10, wherein the Si substrate 10 is covered with the interlayer insulation film 11 that carries thereon the interconnection pattern 12. Further, the SiNCH film 23, the interlayer insulation film 14, the SiNCH film 25, the interlayer insulation film 16 and the SiNCH film 27 are stacked consecutively on the interconnection layer 12. In the present embodiment, a resist pattern 28 is provided on the multilayer interconnection structure wherein the resist pattern 28 includes a resist opening 28A corresponding to the interconnection pattern to be formed in the multilayer interconnection structure.

Figure 6B:
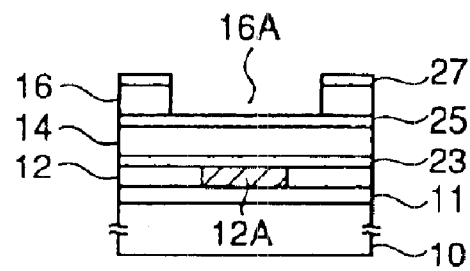

In the step of FIG. 6B, the SiNCH film 27 is subjected to a dry etching process while using the resist pattern 28 as a mask, and there is formed an opening in the SiNCH film 27 in correspondence to the resist opening 28A such that the opening thus formed exposes the interlayer insulation film 16 formed underneath the SiNCH film 27. The interlayer insulation film 16 thus exposed is subsequently subjected to a dry etching process and the opening 16A corresponding to the interconnection groove to be formed is formed in the interlayer insulation film 16 in correspondence to the resist opening 28A so as to expose the underlying SiNCH film 25.

Figure 6C:
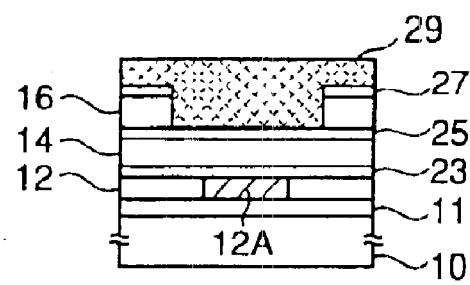
Figure 6D:
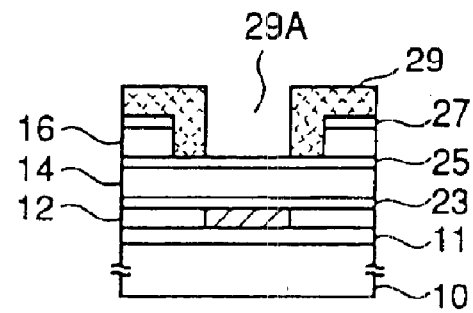

Next, the resist film 28 is removed in the step of FIG. 6C and a resist film 29 is formed newly on the structure of FIG. 6B such that the resist film 29 fills the opening 16A. Further, the resist film 29 is patterned by a photolithographic process in the step of FIG. 6D to form a resist opening 29A in the resist film 29 in correspondence to the contact hole to be formed in the multilayer interconnection structure.

Figure 6E:
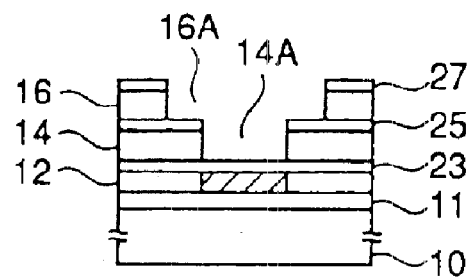

Next, in the step of FIG. 6E, a part of the SiNCH film 25 exposed by the resist opening 29A is subjected to a dry etching process while using the resist pattern 29 as a mask, and there is formed an opening in the SiNCH film 25 in correspondence to the resist opening 29A so as to expose the underlying interlayer insulation film 14. Thereafter, the resist pattern 29 is removed and the interlayer insulation film 14 is subjected to a dry etching process while using the SiNCH films 27 and 25 as a hard mask. As a result, the opening 14A is formed in the interlayer insulation film 14 in correspondence to the resist opening 29A and hence in correspondence to the contact hole of the multilayer interconnection structure to be formed.

The dry etching process for forming the opening 14A stops upon exposure of the SiNCH film 23. After this, the exposed SiNCH films 27, 25 and 23 are removed and the openings 16A and 14A are filled by a conductive layer such as a Cu layer. As a result, the multilayer interconnection structure explained with reference to FIG. 6F is obtained.

In the present embodiment, too, it is possible to use any of the inorganic low-dielectric insulation films such as a F-doped $SiO_2$ film, an HSQ film such as an SiOH film or a porous insulation film, or the organic low-dielectric insulation films such as an organic SOG film or an organic insulation film of aromatic family. As a result, the multilayer interconnection structure of the present embodiment has an advantageous feature of reduced overall dielectric constant and the operational speed of the semiconductor device is improved substantially.

In the present embodiment, too, the SiNCH films 23, 25 and 27 are characterized by low specific dielectric constant, excellent adhesion, excellent dry etching resistance, excellent performance of diffusion barrier for Cu and low leakage current. Thus, the SiNCH films of the present invention are ideal for application to a multilayer interconnection structure of high-speed semiconductor devices.

[Fifth Embodiment]

FIGS. 7A–7E show the fabrication process of a semiconductor device according to a fifth embodiment of the present invention, wherein those parts corresponding to the parts described previously are designated by the same reference numerals and the description thereof will be omitted.

Figure 7A:
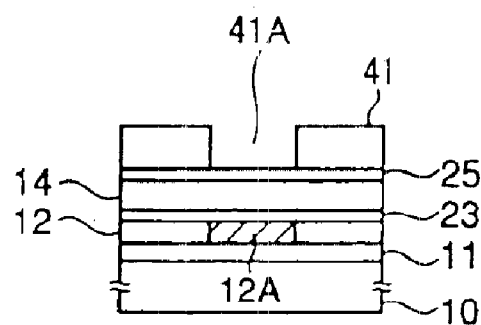
FIGS. 7A–7E are diagrams showing the fabrication process of a semiconductor device according to a fifth embodiment of the present invention.

Referring to FIG. 7A, there is formed a layered structure on the Si substrate 10 similarly to the previous embodiments, wherein the Si substrate 10 carries thereon the interlayer insulation film 11, and the interlayer insulation film 12 carries thereon the interconnection layer 12. On the interconnection layer 12, the SiNCH film 23, the interlayer insulation film 14 and the SiNCH film 25 are stacked consecutively, wherein the SiNCH film 25 carries thereon a resist pattern having a resist opening 41A corresponding to the contact hole to be formed in the multilayer interconnection structure.

The resist opening 41A exposes the SiNCH film 25, and thus, the SiNCH film 25 is subjected to a dry etching process. As a result, there is formed an opening 25A in the SiNCH film 25 in correspondence to the resist opening 41A.

Figure 7B:
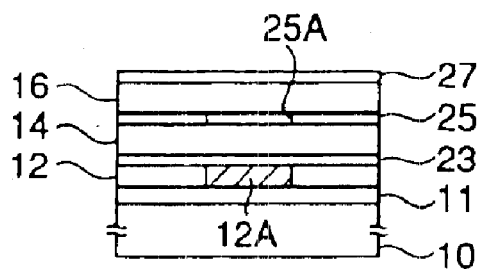

Next, in the step of FIG. 7B, the interlayer insulation film 16 is deposited on the SiNCH film 25 so as to fill the opening 25A, followed by a deposition of the SiNCH film 27 further on the interlayer insulation film 16.

Figure 7C:
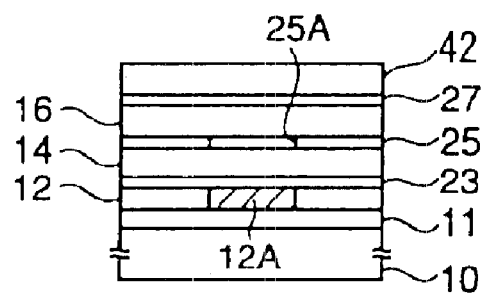
Figure 7D:
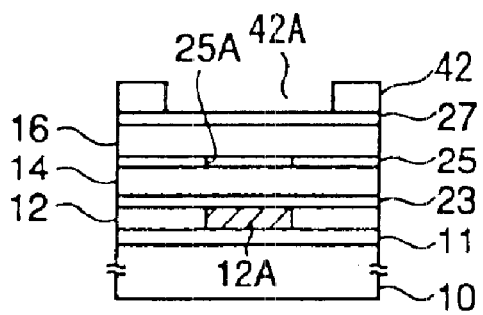

Next, in the step of FIG. 7C, a resist film 42 is applied on the SiNCH film 27, wherein the resist film 42 is patterned in the step of FIG. 7D by a photolithographic process to form an opening 42A in the resist film 42 in correspondence to the interconnection pattern to be formed in the multilayer interconnection structure.

Figure 7E:
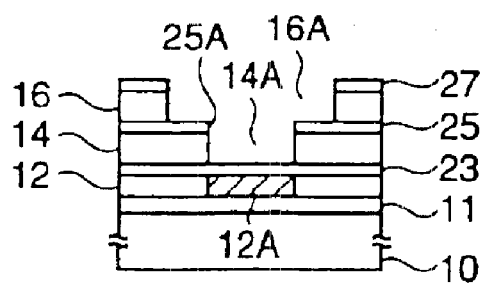

Next, in the step of FIG. 7E, the exposed part of the SiNCH film 27 exposed at the opening 42A is subjected to a dry etching process while using the resist film 42 as a mask, until the underlying interlayer insulation film 16 is exposed.

Next, the interlayer insulation film 16 is subjected to a dry etching process, and the opening 16A is formed in the interlayer insulation film 16 in correspondence to the foregoing resist opening 42A, and hence in correspondence to the interconnection groove to be formed. It should be noted that the dry etching process of the interlayer insulation film 16 stops upon exposure of the SiNCH film 25 in the part where the SiNCH film 25 is formed, while in the part where the opening 25A is formed in the film 25, the dry etching proceeds through the opening 25A into the underlying interlayer insulation film 14 and forms the opening 14A in the interlayer insulation film 14 in correspondence to the foregoing opening 25A and hence the contact hole to be formed in the multilayer interconnection structure.

The dry etching process for forming the opening 14A stops upon exposure of the SiNCH film 23. Thereafter, the exposed SiNCH films 27, 25 and 23 are removed and the openings 16A and 14A are filled by a conductor layer of Cu, and the like. As a result, the multilayer interconnection structure explained with reference to FIG. 6F is obtained.

In the present embodiment, too, any of the inorganic low-dielectric films such as a F-doped SiO2 film, an HSQ film such as an SiOH film or a porous insulation film, or the organic low-dielectric films such as an organic SOG film or an aromatic family organic low-dielectric insulation film can be used for the interlayer insulation films 14 and 16. Thereby, the overall dielectric constant is reduced for the multilayer interconnection structure and the operational speed of the semiconductor device is improved.

In the present embodiment, too, the SiNCH films 23, 25 and 27 have various preferable characteristics such as low specific dielectric constant, excellent adhesion, excellent dry etching resistance, excellent performance of diffusion barrier for Cu and low leakage current, and thus, the SiNCH films of the present invention are ideal for use in the multilayer interconnection structure of a high-speed semiconductor device.

[Sixth Embodiment]

FIGS. 8A–8E are diagrams showing the fabrication process of a semiconductor device having a multilayer interconnection structure according to a sixth embodiment of the present invention that uses the technology of so-called clustered hard mask, wherein those parts corresponding to the parts described previously are designated by the same reference numerals and the description thereof will be omitted.

In the present embodiment, the SiNCH film 23, the interlayer insulation film 14, the SiNCH film 25, the interlayer insulation film 16 and the SiNCH film 27 are stacked consecutively, similarly to the previous embodiments. Further, an $SiO_2$ film 43 is formed on the SiNCH film 27 by a plasma CVD process or a spin-coating process, and the $SiO_2$ film 43 thus formed is covered by the resist film 18 that includes the resist opening 18A formed in correspondence to the contact hole to be formed in the multilayer interconnection structure. The SiNCH film 27 and the SiO2 film 43 form together a clustered mask.

Figure 8A:
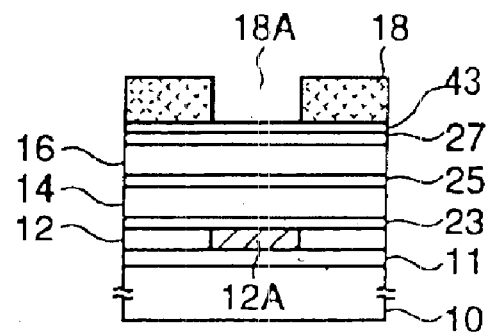
FIGS. 8A–8E are diagrams showing the fabrication process of a semiconductor device according to a sixth embodiment of the present invention.

In the step of FIG. 8A, a dry etching process is applied to the $SiO_2$ film 43 while using the resist film 18 as a mask, and there is formed an opening in the $SiO_2$ film 43 in correspondence to the resist opening 18A so as to expose the SiNCH film 27 located underneath the $SiO_2$ film 43. Further, the SiNCH film 27 thus exposed is subjected to a dry etching process, and the opening 27A is formed in the SiNCH film 27 in correspondence to the resist opening 18A so as to expose the interlayer insulation film 16 as represented in FIG. 8B.

Figure 8B:
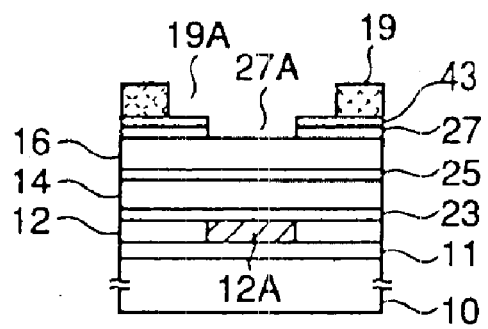
Figure 8C:
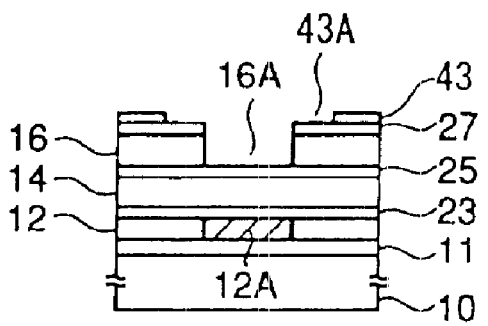

In the step of FIG. 8B, the resist film 19 having the resist opening 19A in correspondence to the interconnection groove to be formed in the multilayer interconnection structure is formed on the $SiO_2$ film 43 so as to expose the $SiO_2$ film 43, wherein the $SiO_2$ film 43 thus exposed is removed by a dry etching process in the step of FIG. 8C while using the resist film 19 as a mask. Thereby, it should be noted that the SiNCH film 27 functions as an etching stopper, and as a result, there is formed an opening 43A in the SiO2 film 43 in correspondence to the resist opening 19A so as to expose the SiNCH film 27.

In the step of FIG. 8C, the dry etching of the interlayer insulation film 16 proceeds simultaneously with the dry etching process of the SiO2 film 43 in the opening 27A, and as a result, the opening 16A corresponding to the opening 17A is formed in the multilayer interconnection structure 16. In this step, the SiNCH film 27 is used as a hard mask. In the opening 16A, the SiNCH film 25 is exposed.

Figure 8D:
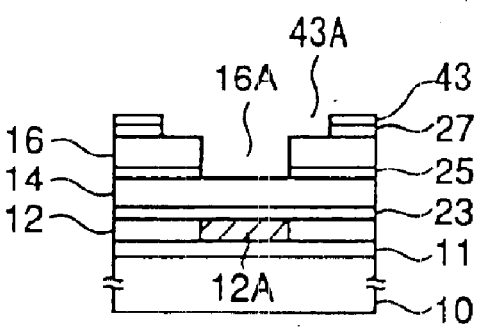

Next, in the step of FIG. 8D, the SiNCH film 27 exposed at the opening 43A and the SiNCH film 25 exposed at the opening 16A are removed by a dry etching process, and the interlayer insulation film 16 is exposed at the opening 43A. Similarly, the interlayer insulation film 14 is exposed at the opening 16A.

Figure 8E:
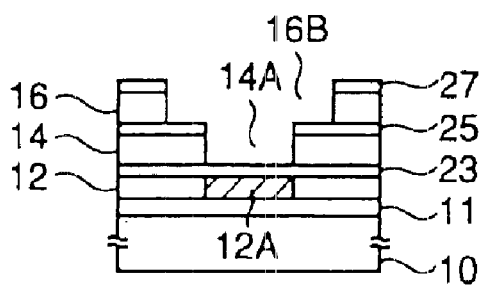

Next, in the step of FIG. 8E, the exposed part of the interlayer insulation film 16 exposed at the opening 43A and the exposed part of the interlayer insulation film 14 exposed at the opening 16A are removed by a dry etching process, and there is formed an opening 16B in the interlayer insulation film 16 in correspondence to the resist opening 19A, and hence in correspondence to the interconnection groove to be formed. Similarly, the opening 14A is formed in the interlayer insulation film 14 in correspondence to the resist opening 18A, and hence in correspondence to the contact hole to be formed.

Further, the exposed SiNCH films 27, 25 and 23 are removed in the step of FIG. 8E, and the openings 16A and 14A are filled with a conductor layer of Cu. Thereby, the multilayer interconnection structure explained with reference to FIG. 6F is obtained.

In the present embodiment, too, the SiNCH films 23, 25 and 27 have preferable feature of low specific dielectric constant, excellent adhesion, excellent dry etching resistance, excellent performance as diffusion barrier of Cu, and low leakage current. Thus, the SiNCH films of the present invention are ideal for use in a multilayer interconnection structure of a high-speed semiconductor device.

[Seventh Embodiment]

Figure 9:
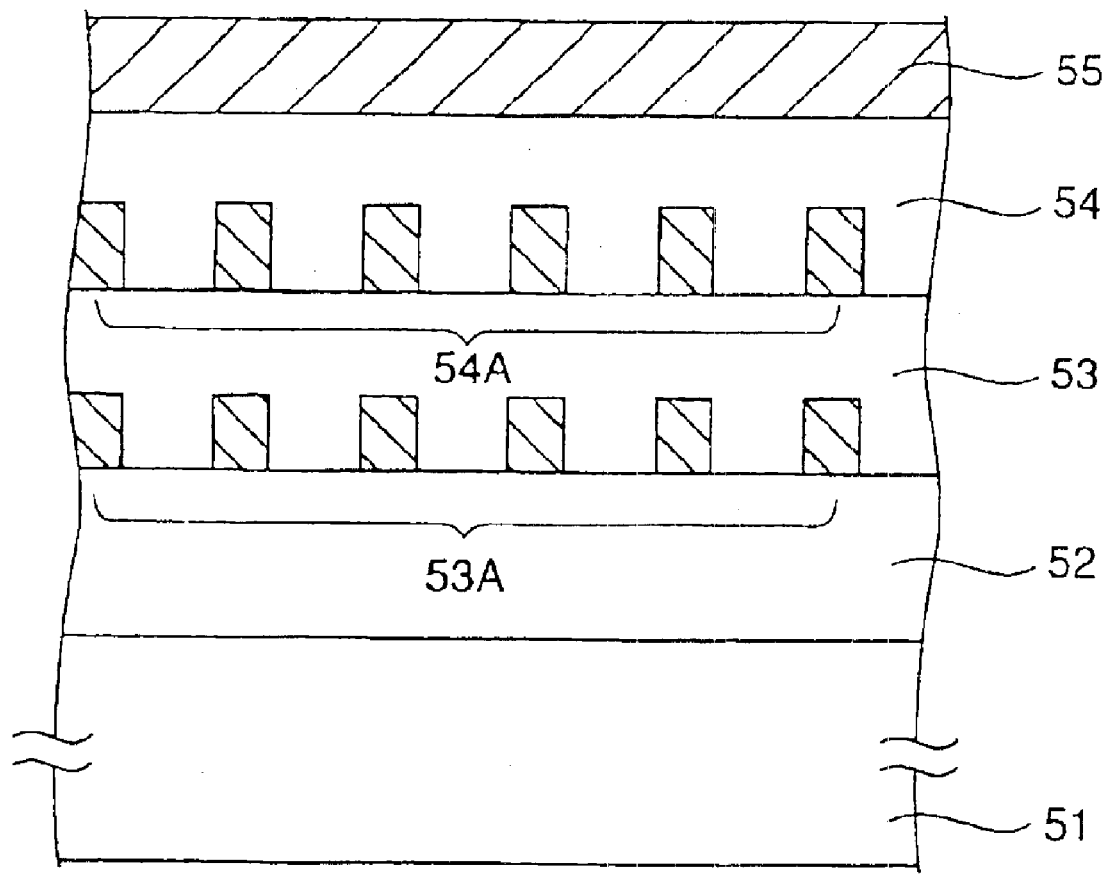
FIG. 9 is a diagram showing the construction of a semiconductor device according to a seventh embodiment of the present invention.

FIG. 9 shows the construction of a semiconductor device 50 according to a seventh embodiment of the present invention.

Referring to FIG. 9, the semiconductor device includes a Si substrate 51 carrying active devices not illustrated, wherein the Si substrate 51 carries an insulation film 52 provided so as to cover the active devices. On the insulation film 52, there is formed a first layer-interconnection pattern 53A and an interlayer insulation film 53 is formed on the insulation film 52 so as to cover the inter connection pattern 53A. Further, the interlayer insulation film 53 carries thereon a second layer interconnection pattern 54A and an interconnection pattern 54 is formed on the interlayer insulation film 53 so as to cover the second layer interconnection pattern 54A. The surface of the interlayer insulation film 54 is covered by a silicon nitride passivation film 55.

Figure 10:
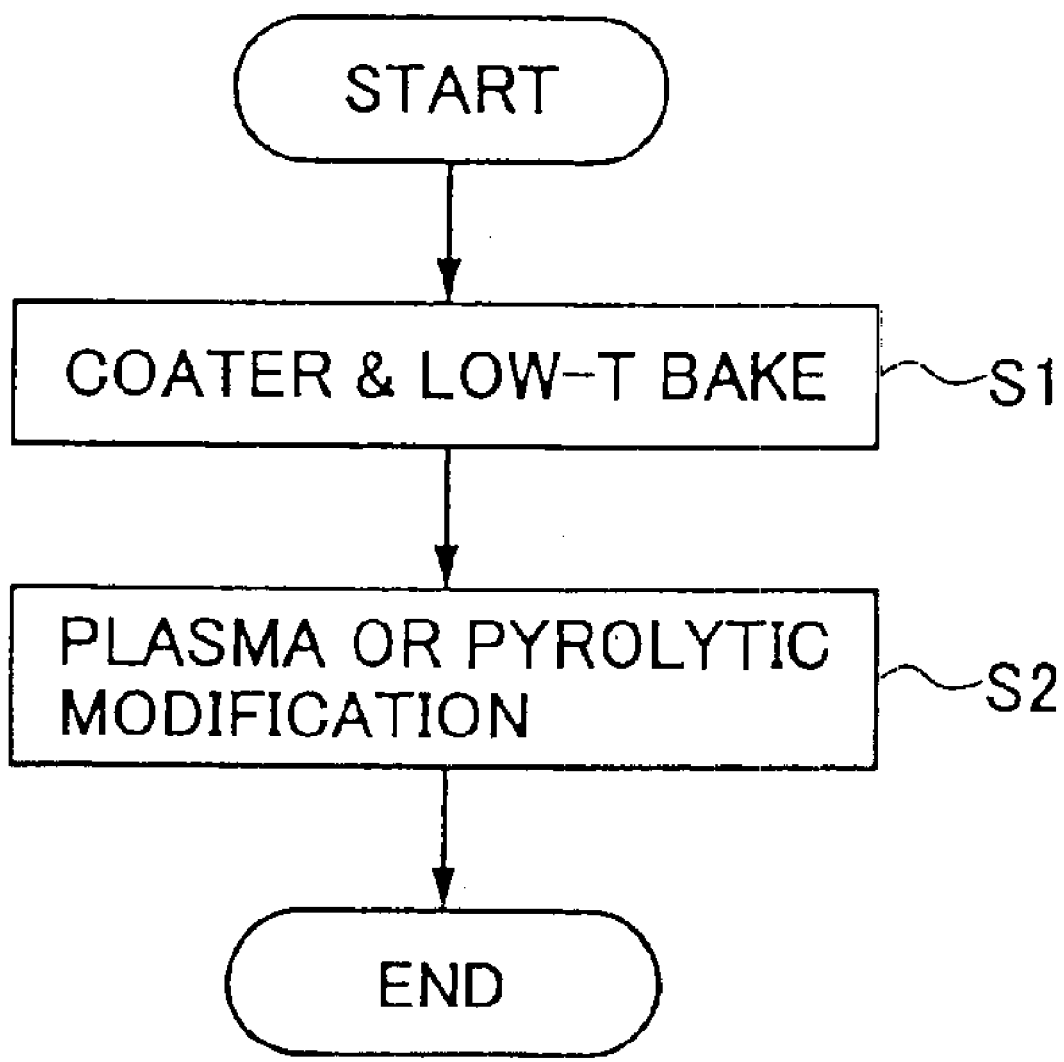
FIG. 10 is a diagram showing the fabrication process of the semiconductor device of the seventh embodiment.

FIG. 10 shows the process of forming the silicon nitride passivation film 55.

Referring to FIG. 10, the semiconductor device 50 is introduced into a spin coater unit in the step 1 when the interlayer insulation film 54 is formed. Thereby, a spin coating film of an organic silazane compound such as the one having a composition of $((SiH_2NH)_n$, n being an integer of 1 or more) is formed on the surface of the interlayer insulation film 54 in correspondence to the passivation film 55. In the step 1, the spin coating film thus formed is subjected to a baking process at a temperature of 100° C. or less for removal of solvents, and a stable silicon nitride film is obtained as a result.

On the other hand, the silicon nitride film obtained in the step 1 of FIG. 10 inevitably contains oxygen, and thus, the process of the present invention proceeds to the step 2 in which the semiconductor device 50 is incorporated into a plasma processing apparatus such as the plasma CVD apparatus of FIG. 2. There, the surface of the silicon nitride film 55 is processed by a plasma gas containing $NH_3$, $N_2$, $H_2$, and the like, and the oxygen in the film is partially substituted with nitrogen. Thereby, the present embodiment carries out the plasma processing of the step 2 before the polymerization is completed in the spin coating film 55.

As a result of such a plasma processing, the silicon nitride film 55 is converted to a film having a chemical formula represented as SiNCH or SiONCH. The film thus obtained has excellent temperature resistance and resistance against chemicals.

Conventionally, it was possible to obtain an oxynitride film by conducting a thermal processing after the step 1 in an N2 atmosphere. However, such a process for converting the film has needed a high temperature of 400° C. or more. Further, in spite of the use of such a high temperature, the conversion of the film quality was not sufficient.

In the present invention, it should be noted that the plasma processing of the step 2 is conducted before the polymerization reaction in the spin coating film 55 is completed. Thus, it becomes possible to achieve an effective surface modification reaction at low temperature. It should be noted that such a plasma processing may be conducted by using $NH_3$ and $SiH_4$ as the plasma gas at the substrate temperature of 350° C. or less, while using a plasma power of 100–1000 W. It is preferable to set the plasma processing conduction such that the OH groups in the film 55 is decreased and the proportion of the N bond is increased.

In the present embodiment, it should be noted that the baking process of the step 1 is conducted at a temperature of 100° C. or less such that the process of the step 2 is conducted before the polymerization reaction is completed in the spin coating film 55. Further, it is preferable to use a single-wafer processing apparatus such that the step 1 and the step 2 are conducted continuously.

It should be noted that the process of the step 2 is by no means limited to a plasma processing but may be a thermal processing conducted in an atmosphere that contains N or H. For example, it is possible to carry out the thermal processing of the step 2 in an atmosphere containing $NH_3$or $N_2$and $H_2$at the temperature of 400° C. or more.

Further, the present invention is not limited to the embodiments described heretofore, but various variations and modifications may be made without departing from the scope of the invention.

INDUSTRIAL APPLICABILITY

According to the present invention, it is possible to obtain a silicon nitride film of the SiNCH system by conducting a CVD process of an organic Si compound that contains therein an organic silazane bond under the condition that the organic silazane bond in the CVD source is preserved in the film. The silicon nitride film thus formed is characterized by low density and low specific dielectric constant. Further, the silicon nitride film thus obtained has preferable features of excellent adhesion and etching resistance and performs as an effective diffusion barrier against metal elements such as Cu. It is possible to form a multilayer interconnection structure having a small stray capacitance by using the silicon nitride film of the present invention.

What is claimed is:

1. A method of fabricating a semiconductor device, comprising the steps of:

forming an etching stopper film on a substrate;

depositing an interlayer insulation film on said etching stopper film; and patterning said interlayer insulation film to form an opening, said step of forming said etching stopper film comprising the steps of:

introducing said substrate into a reaction chamber of a processing apparatus;

supplying an organic Si compound containing an organic silazane bond therein into said reaction chamber as a gaseous source;

forming a plasma of the gaseous source in said reaction chamber; and depositing an SiNCH film containing Si, C, N, and H as primary constituent elements on a surface of said substrate as said etching stopper films, wherein said step of depositing said SiNCH film is conducted with such a plasma power that said silazane bond in said organic Si compound is substantially preserved in said SiNCH film.

2. A method as claimed in claim 1, said organic Si compound has a structural formula of $(SiR_1)_n NR_2$, $(SiR_1NR_2)_n$ or $(SiR_1(NR_2)_{1.5})_n$, where n is an integer of 1 or more and each of $R_1$ and $R_2$ are hydrogen, an alkyl group, a methyl group, a cyclic hydrocarbon group, a phenol group, or a vinyl group.

3. A method as claimed in claim 1, further comprising the step of supplying an additional gaseous source containing N into said reaction chamber in addition to said organic Si compound, and wherein said step of forming said SiNCH film comprises the steps of forming a plasma of said additional gaseous source, and supplying said plasma into said reaction chamber.

4. A method as claimed in claim 1, further comprising the steps of depositing a conductor layer on said interlayer insulation film so as to fill said opening, and removing a part of said conductor layer located above said interlayer insulation film by a chemical mechanical polishing process.

5. A method as claimed in claim 4, wherein said conductor layer comprises a Cu layer.

6. A method as claimed in claim 1, wherein said interlayer insulation film comprises an organic insulation film or an inorganic insulation film.

7. A method as claimed in claim 1, wherein said interlayer insulation film comprises an organic silicon oxide film or a F-doped $SiO_2$ film.

8. A method as claimed in claim 1, wherein said opening comprises an interconnection groove and a contact hole.

9. A semiconductor device, comprising:

a substrate; and a multilayer interconnection structure formed on said substrate, said multilayer interconnection structure comprising an etching stopper film, an interlayer insulation film formed on said etching stopper film, an interconnection groove formed in said interlayer insulation film, a contact hole formed in said interlayer insulation film in correspondence to said interconnection groove, and a conductor pattern filling said interconnection groove and said contact hole, wherein said etching stopper film comprises a SiNCH film and contains therein an arbitrary atomic group represented as $C_n H_m$, said arbitrary atomic group being bonded to a Si atom, and wherein said SiNCH film contains therein a cyclic silazane bond.

10. A method of forming a silicon nitride film, comprising the steps of:

introducing a substrate into a reaction chamber;

supplying an organic Si compound having an organic silazane bond therein into said processing chamber as a gaseous source;

forming a plasma of said gaseous source compound in said reaction chamber; and depositing an SiNCH film containing Si, N, C, and H as primary constituent elements on a surface of said substrate by a plasma polymerization proess, wherein said step of forming said plasma of said gaseous source is conducted with such a plasma power that said silazane bond is preserved substantially in said SiNCH film.

11. A method as claimed in claim 10, wherein said organic Si compound has a structural formula of $(SiR_1)_n NR_2$, $(SiR_1NR_2)_n$, or $(SiR_1(NR_2)_{1.5})_n$, where n is an integer of 1 or more and each of $R_1$ and $R_2$ are hydrogen, an alkyl group, a methyl group, a cyclic hydrocarbon group, a phenol group, or a vinyl group.

12. A method as claimed in claim 10, further comprising the step of supplying an additional gaseous source containing N to said organic Si compound, and wherein said step of depositing said SiNCH film comprises the steps of forming a plasma of said additional gaseous source, and supplying said plasma of said additional gaseous source into said reaction chamber.

13. A method as claimed in claim 10, wherein said step of depositing said SiNCH film is conducted by holding said substrate at a temperature of 200–400° C.

14. A method as claimed in claim 10, wherein said SiNCH film has a dielectric constant of 3.5–5.5.

* * * * *

UNITED STATES PATENT AND TRADEMARK OFFICE
CERTIFICATE OF CORRECTION

PATENT NO. : 6,890,869 B2  Page 1 of 1
APPLICATION NO. : 10/333683
DATED : May 10, 2005
INVENTOR(S) : Gishi Chung It is certified that error appears in the above-identified patent and that said Letters Patent is hereby corrected as shown below:

On the Cover Page, item

(22) should read --PCT Filed: Aug. <u>16</u>, 2001--

Signed and Sealed this

Tenth Day of October, 2006

JON W. DUDAS
*Director of the United States Patent and Trademark Office*